United States Patent
Lee et al.

(10) Patent No.: US 9,343,519 B2
(45) Date of Patent: May 17, 2016

(54) METHOD OF MANUFACTURING ORGANIC LIGHT EMITTING DISPLAY DEVICE

(71) Applicant: LG Display Co., Ltd., Seoul (KR)

(72) Inventors: Seung Hyun Lee, Gyeonggi-do (KR); Hang Sup Cho, Gyeonggi-do (KR); Tae Hyung Lee, Gyeonggi-do (KR); Yong Woo Yoo, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/554,283

(22) Filed: Nov. 26, 2014

(65) Prior Publication Data

US 2015/0147831 A1 May 28, 2015

(30) Foreign Application Priority Data

Nov. 26, 2013 (KR) .................. 10-2013-0144212

(51) Int. Cl.
*H01L 51/52* (2006.01)
*H01L 51/56* (2006.01)
*H01L 27/32* (2006.01)

(52) U.S. Cl.
CPC .......... *H01L 27/3276* (2013.01); *H01L 51/524* (2013.01); *H01L 51/5253* (2013.01); *H01L 51/5234* (2013.01); *H01L 51/5246* (2013.01)

(58) Field of Classification Search
CPC . H01L 51/5234; H01L 51/56; H01L 51/5246; H01L 51/0512; H01L 27/3274; H01L 51/0541; H01L 51/0508; H01L 27/3248; H01L 27/3244
See application file for complete search history.

(56) References Cited

U.S. PATENT DOCUMENTS

| | | | | |
|---|---|---|---|---|
| 8,008,135 B2* | 8/2011 | Shih et al. | ...................... | 438/149 |
| 8,329,523 B2* | 12/2012 | Choi et al. | ...................... | 438/158 |
| 8,445,915 B2* | 5/2013 | You | ................................ | 257/72 |
| 8,637,894 B2* | 1/2014 | Lee et al. | ......................... | 257/99 |
| 8,766,265 B2* | 7/2014 | Lee et al. | ......................... | 257/59 |
| 8,933,451 B2* | 1/2015 | Kim et al. | ......................... | 257/59 |
| 2010/0066240 A1* | 3/2010 | Park et al. | ...................... | 313/504 |
| 2013/0001564 A1* | 1/2013 | Choi et al. | ........................ | 257/59 |
| 2013/0316475 A1* | 11/2013 | Yu et al. | .......................... | 438/26 |
| 2014/0014908 A1* | 1/2014 | Park et al. | ........................ | 257/40 |
| 2014/0042394 A1* | 2/2014 | Lee | .................................. | 257/40 |
| 2014/0140019 A1* | 5/2014 | Park et al. | ...................... | 361/749 |
| 2015/0001497 A1* | 1/2015 | Jung et al. | ....................... | 257/40 |

* cited by examiner

*Primary Examiner* — Savitr Mulpuri
(74) *Attorney, Agent, or Firm* — Morgan, Lewis & Bockius LLP (57) ABSTRACT

Provided is a method of manufacturing an organic light emitting display device. The method includes: providing a first substrate including: a display portion, and a non-display portion, forming a thin film transistor (TFT) and an organic light emitting diode (OLED) in the display portion of the first substrate, providing a pad portion including: at least one pad contact portion at the non-display portion and electrically connected to the TFT, and a pad insulating portion between adjacent pad contact portions, providing an anti-moisture insulation layer entirely covering the first substrate, adhering an encapsulating substrate onto the anti-moisture insulation portion in correspondence with the display portion, and removing the anti-moisture insulation layer, at the pad contact portion, using a laser.

8 Claims, 7 Drawing Sheets

| Laser Type | | SINGLE LAYER ABSORPTION RATE | | | | | |
|---|---|---|---|---|---|---|---|
| | | SiON+ITO+MoTi Stacked actual absorption rate | | | SiNx+ITO+MoTi Stacked actual absorption rate | | |
| | | | ITO | MoTi | SiNx 0.5um | ITO | MoTi |
| 248nm | GAS | 37% | 61% | 2% | 40% | 58% | 2% |
| 266nm | SOLID | 24% | 73% | 3% | 22% | 75% | 3% |
| 255nm | SOLID | 3% | 53% | 42% | 13% | 48% | 37% |
| 232nm | SOLID | 0 | 12% | 80% | 6% | 11% | 75% |

METHOD OF MANUFACTURING ORGANIC LIGHT EMITTING DISPLAY DEVICE

CROSS-REFERENCE TO RELATED APPLICATION(S)

The present application claims benefit and priority under 35 U.S.C. §119(a) of Korean Patent Application No. 10-2013-0144212, filed on Nov. 26, 2013, the entire disclosure of which is hereby incorporated by reference herein for all purposes.

BACKGROUND

1. Technical Field

The following description relates to a method of manufacturing an organic light emitting display device.

2. Discussion of the Related Art

Recently, as times advance to an information-oriented society, importance of flat panel display devices are increasing because of improved characteristics in thinning and lightening thereof and the realization of low consumption power. In the flat panel display devices, liquid crystal display (LCD) devices including a thin film transistor (TFT) have good resolution, color display, and image quality, and thus are commercialized as display devices for notebook computers, tablet computers, and desktop computers. In particular, organic light emitting display devices are self-emitting devices, and have a fast response time, low consumption power, and a wide viewing angle. Therefore, organic light emitting display devices are attracting much attention as next-generation flat panel display devices. Particularly, because a manufacturing process is simple, the manufacturing cost is much reduced compared to a related art LCD device.

An organic light emitting display device includes an organic light emitting diode (OLED) for self-emitting light. The OLED includes an organic compound layer which is formed between an anode electrode and a cathode electrode. The organic compound layer includes a hole injection layer, a hole transport layer, an emission layer, an electron transport layer, and an electron injection layer. When a driving voltage is applied to the anode electrode and the cathode electrode, a positive hole passing through the hole transport layer and an electron passing through the electron transport layer are combined in the emission layer to generate an exciton, and the exciton is shifted from an excited state to a ground state to emit visible light.

The OLED is very vulnerable to moisture and oxygen in air. Therefore, a process of manufacturing an organic light emitting display device needs a process of forming an anti-moisture insulation layer on a substrate to prevent moisture and oxygen from penetrating into the OLED.

Figure 1:
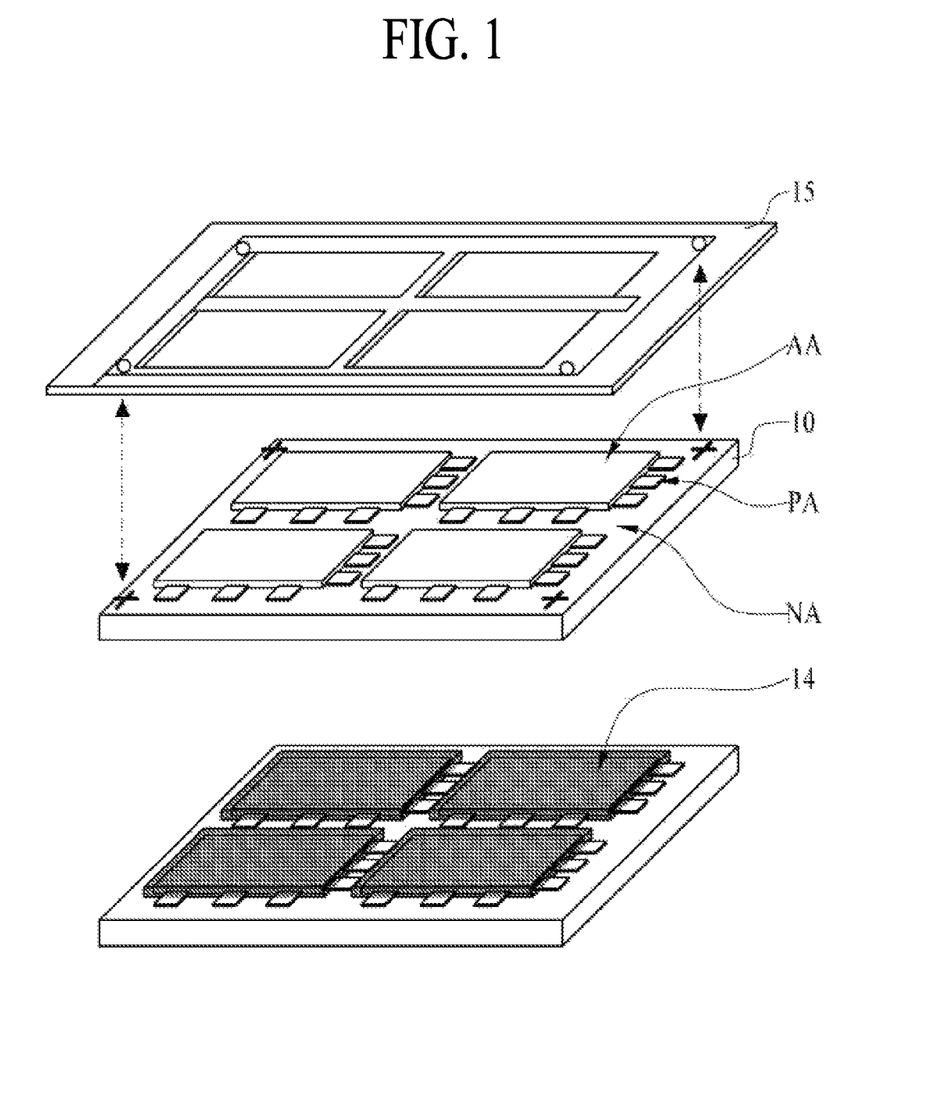
FIG. 1 is a diagram illustrating a manufacturing method of forming an anti-moisture insulation layer of a related art organic light emitting display device.

FIG. 1 is a diagram illustrating a manufacturing method of forming an anti-moisture insulation layer of a related art organic light emitting display device.

With reference to FIG. 1, the related art organic light emitting display device includes an anti-moisture insulation layer 14 which is formed by depositing an inorganic material on a substrate 10, in which a TFT and an OLED are formed, in a plasma enhanced chemical vapor deposition (PECVD) process or a physical vapor deposition (PVD) process such as a sputtering process.

The anti-moisture insulation layer 14 is formed to sufficiently cover a display portion AA including the OLED. However, the anti-moisture insulation layer 14 should not be formed in a non-display portion NA in which a pad portion PA contacting a driver integrated circuit (IC) or a flexible printed circuit (FPC) is provided. To this end, a mask 15 for preventing the anti-moisture insulation layer 14 from being deposited in the non-display portion NA is necessarily needed in forming the anti-moisture insulation layer 14.

The manufacturing method of forming the anti-moisture insulation layer 14 of the related art organic light emitting display device has the following common problems. First, a uniformity of the anti-moisture insulation layer 14 can be reduced due to using a mask shadow. Second, a layer-forming defect can occur due to a partial detachment or misalignment of the mask 15. Third, because the mask 15 is used, a great additional cost is expended for developing and manufacturing an expensive fine alignment system, the mask 15, and operation equipment. Fourth, because the mask 15 is used, the volume of a PECVD chamber increases, and additional equipment is needed, causing a great additional cost to be expended.

SUMMARY

Accordingly, embodiments of the present application are directed to provide a method of manufacturing an organic light emitting display device that substantially obviates one or more problems due to limitations and disadvantages of the related art.

An object of embodiments is to provide a method of manufacturing an organic light emitting display device, which forms an anti-moisture insulation layer on an OLED without using a mask, and thus can reduce the process cost and enhance an efficiency of a process by omitting a mask process.

Additional advantages, objects, and features will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose according to one aspect of the invention, there is provided a method of manufacturing an organic light emitting display device, the method including: providing a first substrate including: a display portion, and a non-display portion, forming a thin film transistor (TFT) and an organic light emitting diode (OLED) in the display portion of the first substrate, providing a pad portion including: at least one pad contact portion at the non-display portion and electrically connected to the TFT, and a pad insulating portion between adjacent pad contact portions, providing an anti-moisture insulation layer entirely covering the first substrate, adhering an encapsulating substrate onto the anti-moisture insulation portion in correspondence with the display portion, and removing the anti-moisture insulation layer, at the pad contact portion, using a laser.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are examples and explanatory and are intended to provide further explanation of the disclosure as claimed.

BRIEF DESCRIPTION OF THE DRAWINGS

The accompanying drawings, which are included to provide a further understanding of the invention and are incorporated in and constitute a part of this specification, illustrate implementations of the invention and together with the description serve to explain the principles of the invention.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present invention, examples of which are illustrated in the accompanying drawings. In the following description, when a detailed description of well-known functions or configurations related to this document is determined to unnecessarily cloud a gist of the invention, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a certain order. Like reference numerals designate like elements throughout. Names of the respective elements used in the following explanations are selected only for convenience of writing the specification and may be thus different from those used in actual products. The terms described in the specification should be understood as follows.

As used herein, the singular forms "a", "an", and "the" are intended to include the plural forms as well, unless the context clearly indicates otherwise. The terms "first" and "second" are for differentiating one element from the other element, and these elements should not be limited by these terms. It should be further understood that the terms "comprises", "comprising,", "has", "having", "includes", and/or "including", when used herein, specify the presence of stated features, integers, steps, operations, elements, and/or components, but do not preclude the presence or addition of one or more other features, integers, steps, operations, elements, components, and/or groups thereof.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item. The term "on" should be construed as including a case where one element is formed at a top of another element and moreover a case where a third element is disposed therebetween.

Hereinafter, embodiments of the present invention will be described in detail with reference to the accompanying drawings.

Figure 2:
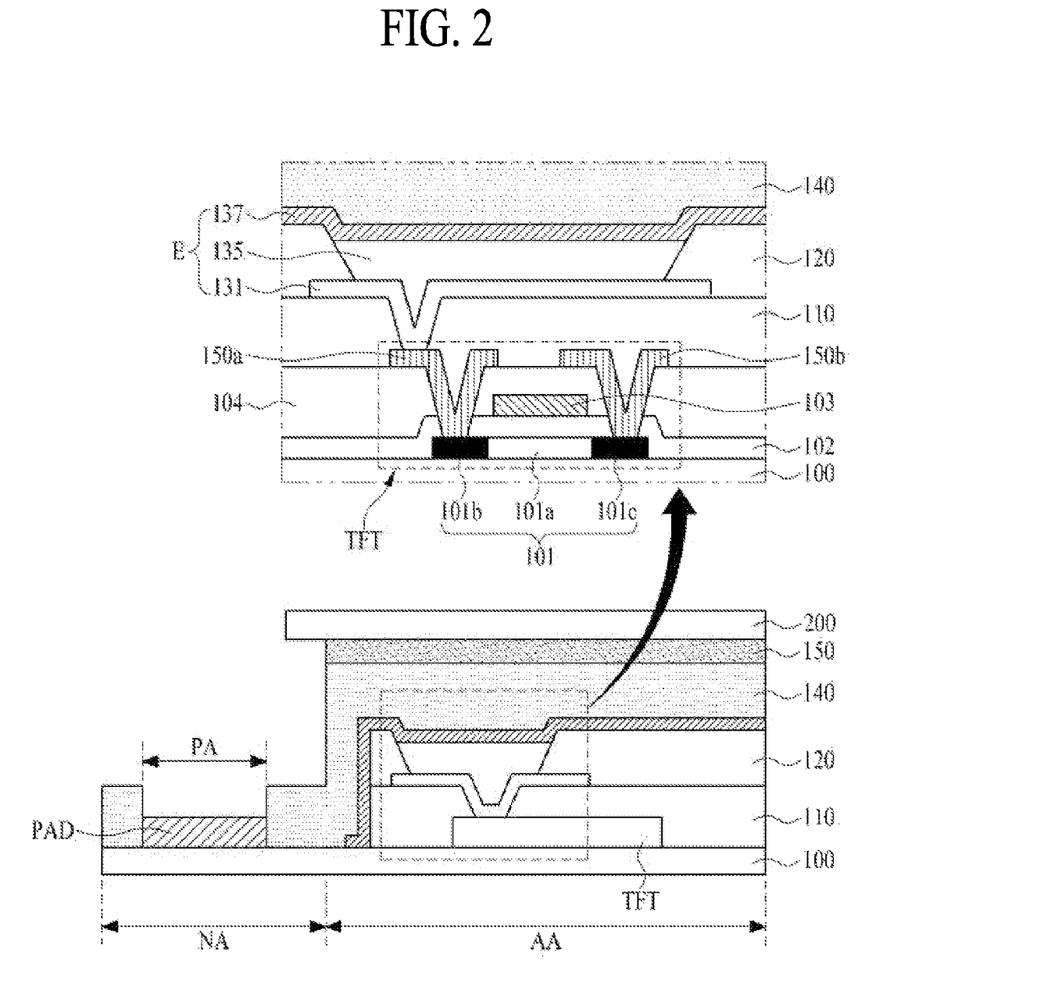
FIG. 2 is a cross-sectional view of an organic light emitting display device according to an embodiment.

FIG. 2 is a cross-sectional view of an organic light emitting display device according to an embodiment.

As seen in the FIG. 2 example, an organic light emitting display device according to an embodiment may include a first substrate 100, in which a thin film transistor (TFT) and an organic light emitting diode (OLED) E are formed, and an encapsulating substrate 200 for encapsulation.

The first substrate 100 may be divided into a display portion AA, which displays an image, and a non-display portion NA which surrounds an edge of the display portion AA. The TFT may be formed on a substrate 100 of the display portion AA. The TFT may include an active layer 101, a gate insulating layer 102, a gate electrode 103, an interlayer insulating layer 104, a source electrode 105a, and a drain electrode 105b.

The active layer 101 may be formed of silicon, and a central portion of the active layer 101 may include an active area 101a, in which a channel is formed, and a source area 101b and a drain area 101c in which high-concentration impurities may be doped on both sides of the active area 101a.

The gate insulating layer 102 may be formed on the active layer 101. The gate electrode 103 and a gate line (not shown), which extends in one direction, may be formed on the gate insulating layer 102 in correspondence with the active area 101a of the active layer 101.

Moreover, the interlayer insulating layer 104 may be formed all over (entirely covering) the gate electrode 103 and the gate line (not shown). The interlayer insulating layer 104 and the gate insulating layer 102 thereunder may include respective contact holes which expose the source area 101b and the drain area 101c that are respectively disposed at both sides of the active area 101a.

A source electrode 105a and a drain electrode 105b may be formed on the interlayer insulating layer 104 including the contact hole. The source electrode 105a and the drain electrode 105b may be separated from each other and may respectively contact the source area 101b and the drain area 101c exposed by the respective contact holes.

A protective layer 110, including a source contact hole which exposes the source electrode 105a, may be formed on the source electrode 105a, the drain electrode 105b, and the interlayer insulating layer 104 which may be exposed between the source electrode 105a and the drain electrode 105b. Although not shown, a data line which intersects the gate line to define the display portion AA may be formed.

A pad portion PA may be formed in the non-display portion NA disposed at an outer portion of the first substrate 100. The pad portion PA may include a pad electrode PAD for supplying a signal voltage from an external power source (not shown) to the TFT and the OLED E.

Moreover, a first electrode 131, connected to the TFT and the source electrode 105a and that is an anode, may be formed on the protective layer 110. An organic emission layer 135 may be formed on the first electrode 131. A bank layer 120 that divides the organic emission layer 135 may be formed on the first electrode 131.

In one example, the organic emission layer 135 may be formed of a single layer formed of a light emitting material. Also, the organic emission layer 135 may be formed of a multilayer including a hole injection layer, a hole transport layer, an emission layer, an electron transport layer, and an electron injection layer.

In each pixel area, the organic emission layer 135 may include a separate organic material that emits light of one color selected from red (R), green (G), and blue (B). A second electrode 127 that is a cathode may be formed on the organic emission layer 135.

In the organic light emitting display device, when a voltage based on a color signal is applied to the first electrode 131 and the second electrode 137, a positive hole injected from the first electrode 131 and an electron supplied from the second electrode 137 are transported to the organic emission layer 135 to generate an exciton, and the exciton is shifted from an excited state to a ground state to generate light which is emitted as visible light. In one example, the emitted light may be output to the outside through the first electrode 131 which is transparent, and thus, the organic light emitting display device may realize an arbitrary image.

An anti-moisture insulation layer 140 having a thin-film type may be formed on the TFT and the OLED E, and an encapsulating substrate 200 may be formed on the anti-moisture insulation layer 140. The first substrate 100 may be bonded to the encapsulating substrate 200 through an adhesive layer 150 having an adhesive characteristic. Therefore, the organic light emitting display device may be encapsulated.

In one example, the pad portion PA which may be provided in the non-display portion NA of the first substrate 100 may be exposed, and the pad electrode PAD which may be exposed may be electrically connected to an FPC (not shown) having a film type. The anti-moisture insulation layer 140 prevents external moisture from penetrating into the OLED E, and thus protects the TFT and the OLED E on the first substrate 100. As such, the anti-moisture insulation layer 140 may be formed on the first substrate 100 to surround the OLED E.

As an example, the anti-moisture insulation layer 140 may be a transparent inorganic insulating layer which may be formed, e.g., of SiON, $SiN_x$, $SiO_2$, $Al_2O_3$, or AlON, and may be formed of one selected from the materials or a multilayer. The anti-moisture insulation layer 140 may be formed to have a thickness of 0.1 μm to 10 μm.

The adhesive layer 150 may be formed of an organic material, such as a monomer or a polymer thin film. The monomer may use, for example, acrylate monomer, phenylacetylene, diamine, dianhydride, siloxane, silane, or parylene. Also, the polymer thin film may use, for example, polyethylene, polypropylene, polyethyelene terephthalate (PET), fluororesin, or polysiloxane. Combinations of the above materials may also be used. The adhesive layer 150 may be formed to have a thickness, e.g., of 0.1 μm to 100 μm. The first substrate 100 and the encapsulating substrate 200 may be formed, e.g., of glass, a plastic material, or stainless steel.

Therefore, a separate deposition mask (not shown) is not needed in forming the anti-moisture insulation layer 140 of the organic light emitting display device according to an embodiment. That is, in the organic light emitting display device according to an embodiment, a laser may be used in exposing the pad portion PA, which is formed in the non-display portion NA of the first substrate 100, and forming the anti-moisture insulation layer 140. The laser will be described in more detail below.

Figure 3:
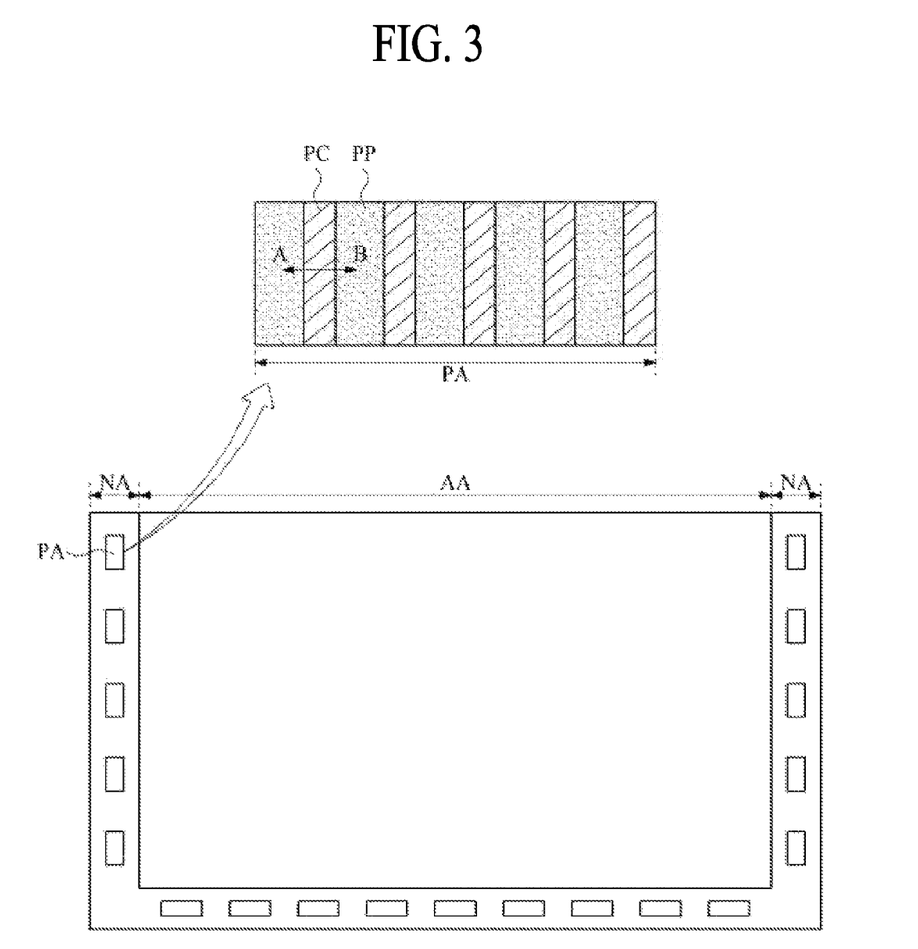
FIG. 3 is a plan view of an organic light emitting display device including a pad portion according to an embodiment.
Figure 4:
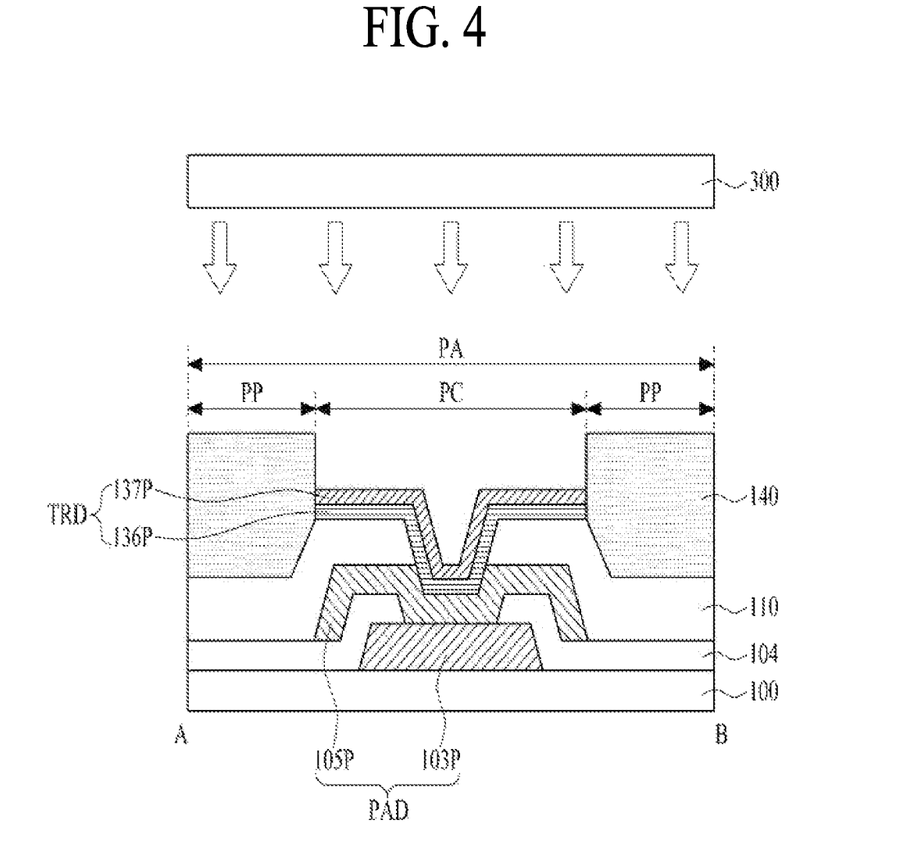
FIG. 4 is a cross-sectional view illustrating a pad portion according to an embodiment, and corresponds to a cross-sectional surface taken along line A-B of FIG. 3.

FIG. 3 is a plan view of an organic light emitting display device including a pad portion according to an embodiment. FIG. 4 is a cross-sectional view illustrating a pad portion according to an embodiment, and corresponds to a cross-sectional surface taken along line A-B of FIG. 3.

With reference to the example of FIG. 3, the organic light emitting display device according to an embodiment may include the display portion AA (including the TFT and the OLED E) and the non-display portion NA (including the pad portion PA). The pad portion PA may include a pad contact portion PC, including the pad electrode PAD, and a pad insulating portion PP disposed between adjacent pad contact portions PC.

To describe the pad portion PA in more detail, as seen in the FIG. 4 example, the pad contact portion PC may include the pad electrode PAD, the protective layer 110, and a transparent electrode layer TRD. The pad insulating portion PP may include the anti-moisture insulation layer 140.

The pad electrode PAD may be formed on a gate pad 103P and the gate insulating layer 140 which may be sequentially stacked on the substrate 100. The pad electrode PAD may include a source/drain material 105P connected to the gate pad 103P. The protective layer 110, including a contact hole which may expose a portion of the pad electrode PAD, may be formed on the pad electrode PAD.

The transparent electrode layer TRD may be formed on the protective layer 110, and may be connected to the pad electrode PAD through the contact hole included in the protective layer 110. For example, the transparent electrode layer TRD may be formed of an ITO 137P, or may be formed of a MoTi 136P and the ITO 137P, or the MoTi 136P.

The anti-moisture insulation layer 140 included in the pad insulating portion PP may be a transparent inorganic insulating layer which may be formed, e.g., of SiON, $SiN_x$, $SiO_2$, $Al_2O_3$, or AlON, and may be formed of one selected from the materials or a multilayer.

Particularly, in the pad contact portion PC, the anti-moisture insulation layer 140 may not be formed on the transparent electrode layer TRD. The anti-moisture insulation layer 140 formed at the pad contact portion PC may be selectively removed by irradiating a laser 300 into the pad portion PA. A more detailed description on this will be made with reference to FIGS. 5A and 5B.

Figure 5A:
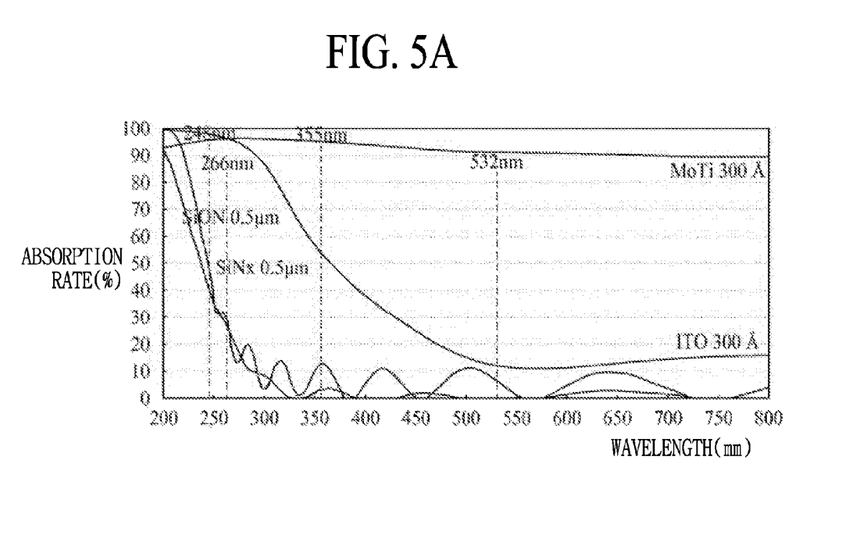
FIG. 5A is a diagram showing an absorption rate of each of SiON, $SiN_x$, MoTi, and indium tin oxide (ITO) with respect to a laser wavelength (nm).
Figure 5B:
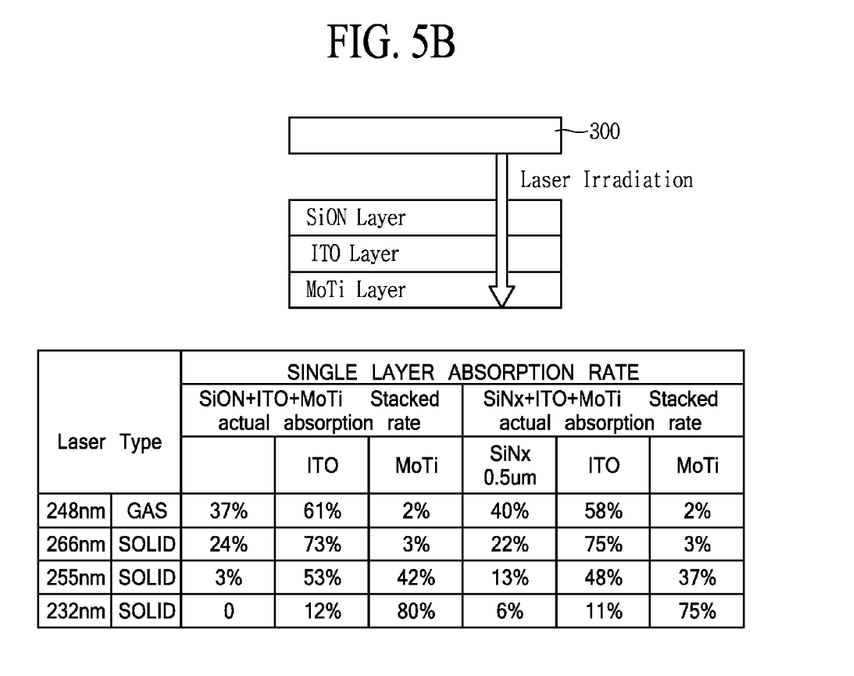
FIG. 5B is a diagram showing an absorption rate with respect to a laser wavelength (nm) when a laser is irradiated onto a position in which MoTi/ITO/SiON or MoTi/ITO/$SiN_x$ are sequentially stacked.

FIGS. 5A and 5B are diagrams for describing an optimal laser wavelength range for selective etching. FIG. 5A is a diagram showing an absorption rate of each of SiON, $SiN_x$, MoTi, and indium tin oxide (ITO) with respect to a laser wavelength (e.g., nm). FIG. 5B is a diagram showing an absorption rate with respect to a laser wavelength (e.g., nm) when the laser 300 is irradiated onto a position in which MoTi/ITO/SiON or MoTi/ITO/$SiN_x$ are sequentially stacked.

As seen in the examples of FIGS. 5A and 5B, a laser absorption rate of SiON or $SiN_x$ is 20% or more at a wavelength of 248 nm (nanometers) or 266 nm, but it can be seen that the laser absorption rate of SiON or $SiN_x$ is considerably lowered at a wavelength of 355 nm or 532 nm. Moreover, it can be seen that a laser absorption rate of MoTi/ITO is higher than the laser absorption rate of SiON or $SiN_x$.

When the laser 300 having a wavelength of 248 nm or 266 nm is irradiated onto the pad contact portion PC in which MoTi/ITO/SiON or MoTi/ITO/$SiN_x$ are sequentially stacked, MoTi/ITO/SiON or MoTi/ITO/$SiN_x$ all absorbs the laser 300, only $SiN_x$ and SiON (which are relatively vulnerable to heat)

are etched, and the transparent electrode layer TRD formed of MoTi/ITO (which is less vulnerable to heat) remains.

On the other hand, because the pad insulating portion PP formed of one selected from SiON, $SiN_x$, and $SiO_2$ does not include a metal layer such as MoTi/ITO, all of the laser 300 passes through the pad insulating portion PP. Thus, the anti-moisture insulation layer 140 formed at the pad insulating portion PP is not etched. Therefore, only the anti-moisture insulation layer 140 formed at the pad contact portion PC may be selectively removed with the laser 300.

In one example, the laser 300 may use an excimer laser having a deep ultraviolet (UV) wavelength, which may be a wavelength range of 100 nm to 300 nm. Based on the experimental results shown in FIGS. 5A and 5B, the use of an excimer layer having a wavelength of 248 nm is optimal.

The embodiments may selectively remove, by using the laser 300, the anti-moisture insulation layer 140 which is formed on the substrate 100, and thus may forms the anti-moisture insulation layer 140 without a separate deposition mask process. Therefore, embodiments may remove a penetration layer-forming defect caused by the partial detachment or misalignment of a mask.

Moreover, embodiments may solve a problem in which, because a mask is used, a high cost is expended for developing and manufacturing an expensive fine alignment system, the mask, and operation equipment. Moreover, embodiments may solve a problem in which, because a mask is used, volume of a PECVD chamber increases, and additional equipment is needed, also causing an increase in cost. Moreover, because the anti-moisture insulation layer 140 formed with the pad portion PA being removed with the laser 300, a mask shadow does not occur. Thus, a uniformity of the anti-moisture insulation layer 140 can be enhanced.

Hereinafter, a method of manufacturing the organic light emitting display device according to an embodiment will be described in more detail with reference to FIGS. 6A to 6E.

FIGS. 6A to 6E are views illustrating a process of manufacturing an organic light emitting display device, according to an embodiment, and relate to a process of manufacturing the organic light emitting display device of FIG. 2. Thus, like reference numerals refer to like elements, and a description on the same element is not repeated.

Figure 6A:
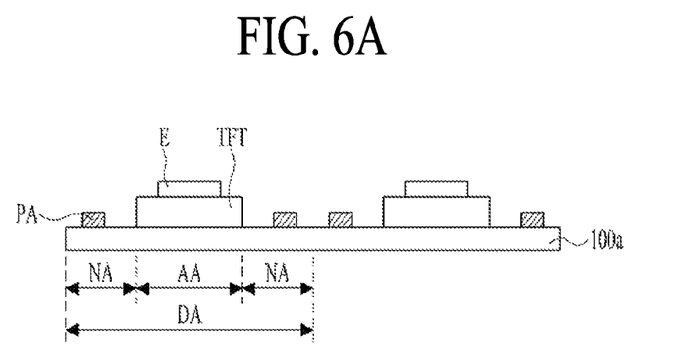
FIGS. 6A to 6E are views illustrating a process of manufacturing an organic light emitting display device, according to an embodiment.

First, as seen in FIG. 6A, the TFT and the pad portion PA may be provided on the first substrate 100 including the display portion AA and the non-display portion NA. Subsequently, the OLED E may be formed on the TFT. In one example, in manufacturing the organic light emitting display device, one large substrate 100a may be used. The first substrate (DA) 100 of one cell unit may be finished by subsequently cutting the substrate 100a.

First, an amorphous silicon layer (not shown) may be formed by depositing amorphous silicon on the display portion AA of the substrate 100a. By irradiating a laser beam onto the amorphous silicon layer or performing thermal treatment, the amorphous silicon layer may be crystallized into a polysilicon layer (not shown)

Subsequently, by performing a mask process, the polysilicon layer (not shown) may be patterned, and the active layer 101 (FIG. 2) which may be in a pure polysilicon state may be formed. In one example, before forming the amorphous silicon layer (not shown), a buffer layer (not shown) may be formed by depositing an inorganic insulating material (for example, $SiO_2$ or $SiN_x$) all over the first substrate 100.

Subsequently, the gate insulating layer 102 (FIG. 2) may be formed by depositing $SiO_2$ on the active layer 101 of pure polysilicon. Subsequently, a first metal layer (not shown) may be formed by depositing a low-resistance metal material (for example, one selected from one or more of aluminum (Al), AlNd, copper (Cu), and a copper alloy) on the gate insulating layer 102 (FIG. 2). By performing the mask process, the gate electrode 103 (FIG. 2) may be formed in correspondence with a central portion of the active layer 101 (FIG. 2). In one example, the gate pad 103P (FIG. 4) may be formed of a gate electrode material at the non-display portion NA of the substrate 100a.

Subsequently, by doping impurities (e.g., a triad or a pentad) all over the first substrate 100 with the gate electrode 103 (FIG. 2) as a blocking mask, the source area 101a and the drain area 101c (FIG. 2) on which impurities are doped may be respectively formed at portions which may be disposed outside the gate electrode 103 (FIG. 2) in the active layer 101 (FIG. 2). A portion overlapping the gate electrode 103 (FIG. 2) may correspond to the active area 101a of pure polysilicon.

Subsequently, the interlayer insulating layer 104 may be formed by depositing an inorganic insulating material, such as $SiN_x$ or $SiO_2$, all over the substrate 100. A contact hole which exposes the source area 101a, the drain area 101c (FIG. 2), and the gate pad 103P (FIG. 4) may be formed by performing the mask process.

Subsequently, a second metal layer (not shown) may be formed by depositing a metal material (for example, one selected from one or more of aluminum (Al), AlNd, copper (Cu), and a copper alloy) on the interlayer insulating layer 104, and the source electrode 105a and the drain electrode 105b (FIG. 3), which may respectively contact the source area 101a and the drain area 101c (FIG. 2) through the contact hole, may be formed by performing the mask process. A source/drain material 105P (FIG. 3), which may be formed on the interlayer insulating layer 104 and may be connected to the gate pad 103P (FIG. 4) though the contact hole, may be formed of the metal material in the non-display portion NA of the substrate 100a.

Subsequently, an organic insulating material, such as photo acryl or benzocyclobutene (BCB), may be coated on the first substrate 100 in which the source electrode 105a and the drain electrode 105b (FIG. 3), and the protective layer 110 (FIG. 2) including a contact hole which exposes the source electrode 105a (FIG. 3) may be formed by performing the mask process. The protective layer 100 (FIG. 4), including a contact hole which may expose the source/drain material 105P (FIG. 3), may be simultaneously formed in the non-display portion NA of the substrate 100a.

Subsequently, the first electrode 131 (FIG. 2) which may be an anode and may contact the source electrode 105a (FIG. 3) through the contact hole included in the protective layer 110 (FIG. 4) may be formed on the protective layer 110 (FIG. 4). Subsequently, a photosensitive organic insulating material (for example, one selected from one or more of black resin, graphite powder, gravure ink, black spray, and black enamel) may be coated on the first electrode 131 (FIG. 2). By patterning the photosensitive organic insulating material, the bank 120 (FIG. 2) may be formed on the first electrode 211 (FIG. 2)

Subsequently, the organic emission layer 135 (FIG. 2) may be formed by coating or depositing an organic light emitting material on the bank 120 (FIG. 2). In one example, the organic emission layer 135 (FIG. 2) may be formed of a single layer formed of a light emitting material, or may be formed of a multilayer including a hole injection layer, a hole transport layer, an emission layer, an electron transport layer, and an electron injection layer, for increasing emission efficiency. Subsequently, the second electrode 137 (FIG. 2) that may be a cathode may be formed by depositing ITO (which may be a transparent conductive material) on the organic emission layer 135 (FIG. 2), which may finish the OLED E.

Moreover, the transparent electrode layer TRD (FIG. 4) may be formed in the non-display portion NA of the substrate 100a. ITO 137P may be deposited on the protective layer 110 (FIG. 4) or may be deposited on MoTi 136P and ITO 137P. The transparent electrode layer TRD (FIG. 4) may be pattern-formed by the mask process.

Figure 6B:
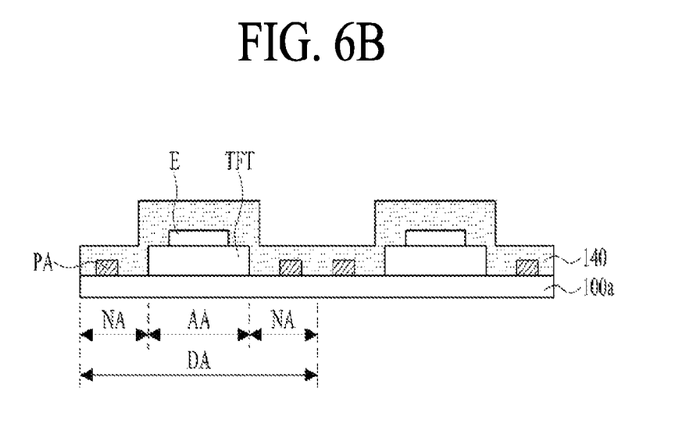

Subsequently, as seen in the FIG. 6B example, the anti-moisture insulation layer 140 may be formed all over the substrate 100a, including the OLED E and the pad portion PA. The anti-moisture insulation layer 140 may be a transparent inorganic insulating layer which may be formed, e.g., of SiON, $SiN_x$, $SiO_2$, $Al_2O_3$, or AlON, and may be formed of one selected from the materials or a multilayer.

The anti-moisture insulation layer 140 may be formed through vapor deposition based on a chemical vapor deposition (CVD). In forming the anti-moisture insulation layer 140, arrangement of facilities may be made with independent facilities. However, a pre-process may be completed, and then, a process of forming the anti-moisture insulation layer 140 may be performed in an inline method without being exposed to the atmosphere. In other words, a vacuum, oxygenless, and/or moisture-free environment may be maintained.

That is, the second electrode 137 (FIG. 2) of the OLED E may be deposited. Then, the anti-moisture insulation layer 140 may be deposited without vacuum exhaust, which may prevent the anti-moisture insulation layer 140 from contacting the atmosphere. Therefore, in a manufacturing process, the inline method may be a way that protects the organic light emitting display device from external oxygen or moisture.

Figure 6C:
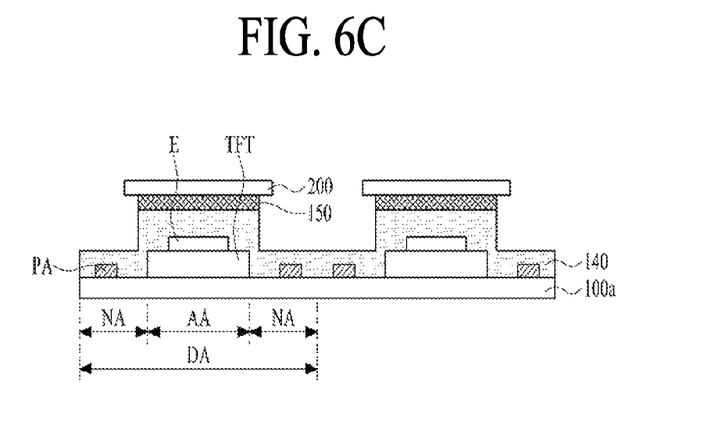

Subsequently, as seen in the FIG. 6C example, the encapsulating substrate 200 including the adhesive layer 150 may be disposed at one surface in correspondence with the display portion AA to face the anti-moisture insulation layer 140 of the substrate 100a, and alignment may be performed. Then, the encapsulating substrate 200 may be adhered to the anti-moisture insulation layer 140 through the adhesive layer 150. Therefore, the substrate 100a may be bonded to the encapsulating substrate 200.

In one example, a series of processes, such as a process of adhering the encapsulating substrate 200 to the adhesive layer 150 and a process of removing a protective film (not shown) of the adhesive layer 150, may be further performed before adhering the encapsulating substrate 200 onto the anti-moisture insulation layer 140. For example, the encapsulating substrate 200 may be formed of glass, stainless steel, or the like.

Figure 6D:
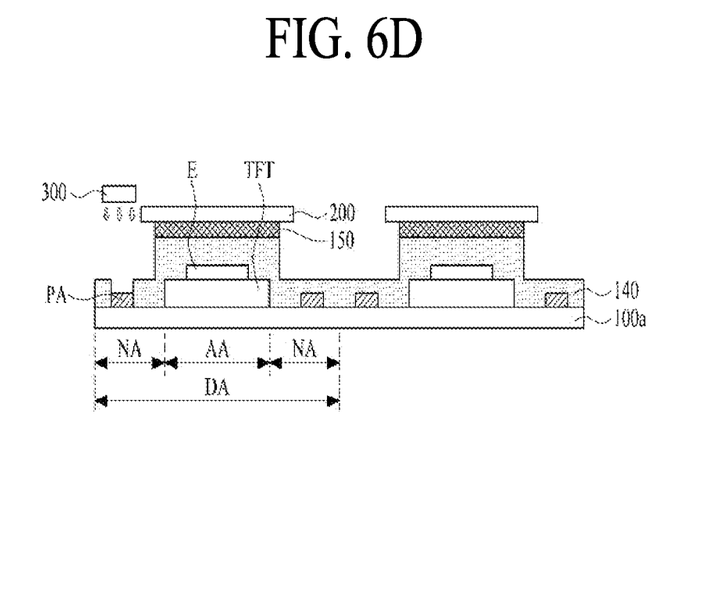

Subsequently, as seen in the FIG. 6D example, the anti-moisture insulation layer 140 which may be formed at the pad contact portion PC included in the pad portion PA may be removed by irradiating the laser 300 onto the pad portion PA of the substrate 100a. In one example, the laser 300 may use an excimer laser having a deep ultraviolet (UV) wavelength, which may be a wavelength range of 100 nm to 300 nm. Based on the experimental results shown in FIGS. 5A and 5B, the use of an excimer layer having a wavelength of 248 nm is optimal. Embodiments may selectively remove, by using the laser 300, the anti-moisture insulation layer 140 which may be formed on the substrate 100, and thus may form the anti-moisture insulation layer 140 without a separate deposition mask process.

Figure 6E:
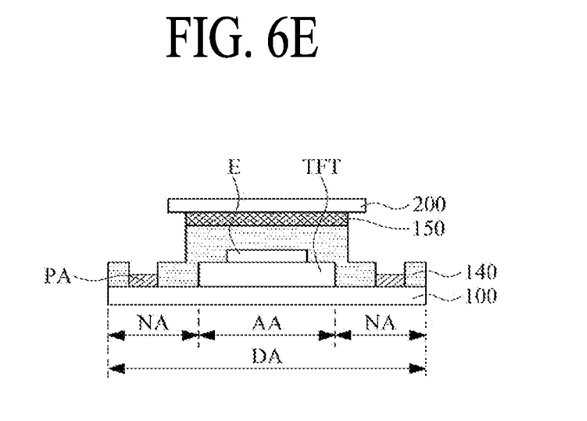

Subsequently, as seen in the FIG. 6E example, the first substrate 100 of a cell unit may be formed by cutting one large substrate 100a into units of a unit array pattern DA. For example, by applying a pressure in order for the adhesive layer 150 to be fully adhered to the anti-moisture insulation layer 140, the first substrate 100 and the encapsulating substrate 200 may be fully bonded to each other to form a panel. Therefore, an organic light emitting display device in which the first substrate 100, including the TFT and the OLED E, is encapsulated by the anti-moisture insulation layer 140 and the encapsulating substrate 200 may be finished.

As described above, according to the organic light emitting display device of an embodiment, in forming the anti-moisture insulation layer 140, the anti-moisture insulation layer 140 (on the pad portion PA) may be selectively removed by irradiating the laser onto the pad portion PA (on the first substrate 100), without performing a separate mask process. Therefore, because a mask is not used, a process is simplified, and the manufacturing cost may be reduced.

Embodiments may selectively remove, using a laser, the anti-moisture insulation layer which is formed on the substrate, and thus may form the anti-moisture insulation layer without a separate mask process. Therefore, embodiments may remove a penetration layer-forming defect caused by a partial detachment or misalignment of a mask.

Moreover, embodiments may solve a problem of the related art in which, because a mask is used, a high cost is expended for developing and manufacturing an expensive fine alignment system, the mask, and operation equipment. In addition, the embodiments may solve a problem of the related art in which, because a mask is used, the volume of a PECVD chamber increases, and additional equipment is needed, causing an increase in cost. Moreover, because the anti-moisture insulation layer formed at the pad portion is removed with a laser in embodiments, a mask shadow does not occur, and thus, a uniformity of the anti-moisture insulation layer may be enhanced.

The pad contact portion may include: a pad electrode disposed at the first substrate; a protective layer disposed on a line layer; a transparent electrode layer disposed on the protective layer; and the anti-moisture insulation layer disposed on the transparent electrode layer. The transparent electrode layer may be formed of indium tin oxide (ITO). The transparent electrode layer may be formed of MoTi and indium tin oxide (ITO) which may be disposed on the MoTi. The anti-moisture insulation layer may be a transparent inorganic insulating layer which is formed of SiON, $SiN_x$, $SiO_2$, $Al_2O_3$, or AlON, and may be formed of one selected from the materials or a multilayer. The laser may use an excimer laser having a deep ultraviolet (UV) wavelength. The deep UV wavelength may be a wavelength range of 100 nm to 300 nm.

The pad insulating layer may be a transparent inorganic insulating layer which may be formed, e.g., of SiON, $SiN_x$, $SiO_2$, $Al_2O_3$, or AlON, and may be formed of one selected from the materials or a multilayer. The removing of the anti-moisture insulation layer may include the anti-moisture insulation layer, which may be disposed on the transparent electrode layer, by using the laser. When a metal such as ITO or MoTi is not disposed under the anti-moisture insulation layer, the anti-moisture insulation layer may not be removed by the laser. The transparent electrode layer may not be removed by the laser.

It will be apparent to those skilled in the art that various modifications and variations can be made in the present invention without departing from the spirit or scope of the invention. Thus, it is intended that embodiments of the present invention cover the modifications and variations of this invention provided they come within the scope of the appended claims and their equivalents.

What is claimed is:

1. A method of manufacturing an organic light emitting display device, the method comprising:
providing a first substrate comprising:

a display portion; and
a non-display portion;
forming a thin film transistor (TFT) and an organic light emitting diode (OLED) in the display portion of the first substrate;
providing a pad portion comprising:
at least one pad contact portion having a electrode at the non-display portion and electrically connected to the TFT, wherein providing the pad contact portion further comprises: providing a pad electrode at the first substrate; providing a protective layer on a line layer; providing a transparent electrode layer on the protective layer; and providing the anti-moisture insulation layer on the transparent electrode layer;
a pad insulating portion between adjacent pad contact portions;
providing an anti-moisture insulation layer entirely covering the first substrate;
adhering an encapsulating substrate onto the anti-moisture insulation portion in correspondence with the display portion; and
subsequently removing the anti-moisture insulation layer, at the pad contact portion, using a laser, without removing the electrode of the pad contact portion.

2. The method of claim 1, wherein the transparent electrode layer comprises indium tin oxide (ITO).

3. The method of claim 1, wherein providing the transparent electrode layer comprises:
providing MoTi; and
providing indium tin oxide (ITO) on the MoTi.

4. The method of claim 1, wherein the anti-moisture insulation layer comprises a transparent inorganic insulating layer comprising one of, or a multilayer of: SiON, $SiN_x$, $SiO_2$, $Al_2O_3$, or AlON.

5. The method of claim 1, wherein the laser uses an excimer laser comprising a deep ultraviolet (UV) wavelength.

6. The method of claim 5, wherein the deep UV wavelength is a wavelength range of 100 nm to 300 nm.

7. The method of claim 1, wherein the pad insulating layer comprises a transparent inorganic insulating layer comprising one of, or a multilayer of: SiON, $SiN_x$, $SiO_2$, $Al_2O_3$, or AlON.

8. The method of claim 1, wherein the removing of the anti-moisture insulation layer comprises removing the anti-moisture insulation layer, on the transparent electrode layer, by using the laser.

* * * * *